United States Patent
Wang et al.

(10) Patent No.: US 12,009,031 B2
(45) Date of Patent: Jun. 11, 2024

(54) MEMORY ARRAY

(71) Applicant: Shanghai Huahong Grace Semiconductor Manufacturing Corporation, Shanghai (CN)

(72) Inventors: Ning Wang, Shanghai (CN); Kegang Zhang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 190 days.

(21) Appl. No.: 17/888,294

(22) Filed: Aug. 15, 2022

(65) Prior Publication Data
US 2023/0268000 A1    Aug. 24, 2023

(30) Foreign Application Priority Data
Feb. 18, 2022   (CN) .......................... 202210149566.5

(51) Int. Cl.
| | |
|---|---|
| G11C 16/04 | (2006.01) |
| G11C 16/10 | (2006.01) |
| G11C 16/16 | (2006.01) |
| G11C 16/26 | (2006.01) |

(52) U.S. Cl.
CPC .......... G11C 16/0466 (2013.01); G11C 16/10 (2013.01); G11C 16/16 (2013.01); G11C 16/26 (2013.01)

(58) Field of Classification Search
CPC .................................................. G11C 16/0466
USPC ..................................................... 365/185.05
See application file for complete search history.

(56) References Cited

U.S. PATENT DOCUMENTS

2014/0035616 A1*  2/2014  Oda ................. H03K 19/17748
                                                    326/38
2018/0068735 A1*  3/2018  Hirose ............. G11C 29/50004

* cited by examiner

*Primary Examiner* — Hoai V Ho
(74) *Attorney, Agent, or Firm* — Murtha Cullina, LLP

(57) ABSTRACT

A memory array that includes a plurality of storage cells, a plurality of bit lines, a plurality of memory transistor word lines and a plurality of selection transistor word lines, wherein the storage cells form an array of M rows*N columns; each storage cell includes a selection transistor and a memory transistor connected in series; a source and a gate of each selection transistor are connected, and the gates of the selection transistors in the same row are connected to a corresponding selection transistor word line.

6 Claims, 4 Drawing Sheets

MEMORY ARRAY

CROSS-REFERENCE TO RELATED APPLICATIONS

This application claims priority to Chinese patent application No. CN 202210149566.5 filed at CNIPA on Feb. 18, 2022, and entitled "MEMORY ARRAY", the disclosure of which is incorporated herein by reference in entirety.

TECHNICAL FIELD

The disclosure relates to the technical field of memory devices, in particular to a memory array.

BACKGROUND OF THE DISCLOSURE

FIG. 1 illustrates a structural diagram of a traditional common-source two-transistor array memory device. This memory device includes a plurality of storage cells arranged in array, and each storage cell consists of a memory transistor and a selection transistor connected in series. As illustrated in FIG. 1, the memory cells A1, A2, B1 and B2 form a 2*2 array. Bit lines of the memory cells in different columns are BL1 and BL2 respectively. Word lines can be divided into selection transistor word line (WL) and memory transistor word line (WLS). WLS horizontally connects the gates of the memory transistors in the same row. WL horizontally connects the gates of the selection transistors in the same row. The memory transistor word lines are WLS1 and WLS2 respectively. The selection transistor word lines are WL1 and WL2 respectively. Source ends are connected together back to back, and then are connected horizontally by using SL. The whole memory array shares a well region.

TABLE 1

| | Cell | Vwl | Vwls | Vbl | Vsl | Vbpw |
|---|---|---|---|---|---|---|
| Erase | A1, A2 | Vpwr | Vneg | Vpos | float | Vpos |
| | B1, B2 | Vpwr | Vpos | Vpos | float | |
| Program | A1 | Vneg | Vpos | Vneg | float | Vneg |
| | A2 | Vneg | Vpos | Vneg/Vp0 | float | |
| | B2 | Vneg | Vneg | Vneg/Vp0 | float | |
| | B1 | Vneg | Vneg | Vneg | float | |
| Read | A1 | Vpwr | Vgnd | Vlim | Vgnd | Vgnd |
| | A2 | Vpwr | Vgnd | Vgnd | Vgnd | |
| | B2 | Vgnd | Vgnd | Vgnd | Vgnd | |
| | B1 | Vgnd | Vgnd | Vlim | Vgnd | |

Table 1 shows an operation mode of a memory device arranged in a common-source two-transistor array. It is assumed that the row and column of the storage cell A1 are a selected row and a selected column respectively. It is defined that the voltage applied to the selection transistor word line is Vwl, the voltage applied to the memory transistor word line is Vwls, the voltage applied to the bit line is Vbl, the voltage applied to the well region is Vbpw, and the voltage applied to the source line is Vsl. 1) A row operation mode (page mode) is adopted for erasing and writing, and the bits in the same row are erased and written at the same time, and the value after erasing is 0; the writing of values includes writing of "1" or writing of "0". When "1" is written, the voltage applied to BL2 is Vneg; when "0" is written, the voltage applied to BL2 is Vp0. 2) During reading, the voltage applied to the BL1 in the selected column is Vlim; the voltage applied to the BL1 in the non-selected column is Vgnd; the voltage applied to the selection transistor in the selected row is Vpwr and the voltage applied to the memory transistor is Vgnd; the voltage applied to the selection transistor in the non-selected row is Vgnd, and the voltage applied to the memory transistor is Vgnd.

However, for the traditional common-source two-transistor array memory device, at least one source line needs to be disposed in the horizontal direction, the peripheral circuit design is more complicated, and more chip design area is occupied.

SUMMARY

The disclosure provides a memory array, which can solve at least one of the problems that a source line needs to be disposed horizontally in the existing memory array, more chip design area is occupied by the memory device and the peripheral circuit design is too complicated.

In one aspect, the embodiment of the disclosure provides a memory array, which includes:

a plurality of storage cells forming an array of M rows*N columns, each storage cell including a selection transistor and a memory transistor connected in series;

a plurality of bit lines arranged at intervals along the direction of columns, wherein drains of the memory transistors in the same column are connected to a corresponding bit line;

a plurality of memory transistor word lines arranged at intervals along the direction of rows; and a plurality of selection transistor word lines arranged at intervals along the direction of rows, wherein the memory transistor word lines and the selection transistor word lines are arranged alternately, gates of the memory transistors in the same row are connected to a corresponding memory transistor word line, a source and a gate of each selection transistor are connected, the gates of the selection transistors in the same row are connected to a corresponding selection transistor word line, and all storage cells share a well region;

erasing, programming and reading of the storage cells are realized by applying certain voltage to the selection transistor word lines connected to the gates of the selection transistors, the memory transistor word lines connected to the gates of the memory transistors and the bit lines connected to the drains of the memory transistors.

Exemplarily, in the memory array, it is defined that the voltage applied to the selection transistor word line is Vwl, the voltage applied to the memory transistor word line is Vwls, the voltage applied to the bit line is Vbl and the voltage applied to the well region is Vbpw;

it is defined that Vpos is first positive voltage, Vneg is negative voltage, Vpwr is a voltage higher than the threshold voltage of the selection transistor, Vgnd is ground voltage and Vp0 is second positive voltage;

during an erasing operation, a row operation mode is adopted, and the Vwl connected to the gates of the selection transistors in a selected row and a non-selected row is Vpos; the Vwls connected to the gates of the memory transistors in the selected row is Vneg; the Vwls connected to the gates of the memory transistors in the non-selected row is Vpos; the Vbl connected to the drains of the memory transistors in all columns is Vpos; the voltage Vbpw applied to the well region is Vpos;

during a programming and writing operation, the row operation mode is adopted; when data "1" is written, the Vwl connected to the gates of the selection transistors in the selected row and the non-selected row is Vneg; the Vwls connected to the gates of the memory transistors in the selected row is Vpos; the Vwls connected to the gates of the memory transistors in the non-selected row is Vneg; the Vbl connected to the drains of the memory transistors in the same column is Vneg, and the voltage Vbpw applied to the well region is Vneg; when data "0" is written, the Vwl connected to the gates of the selection transistors in the selected row and the non-selected row is Vneg; the Vwls connected to the gates of the memory transistors in the selected row is Vpos; the Vwls connected to the gates of the memory transistors in the non-selected row is Vneg; the Vbl connected to the drains of the memory transistors in the same column is Vp0; the voltage Vbpw applied to the well region is Vneg;

during a reading operation, the Vwl connected to the gates of the selection transistors in the selected row is Vpwr; the Vwl connected to the gates of the selection transistors in the non-selected row is Vgnd; the Vwls connected to the gates of the memory transistors in the selected row and the non-selected row is Vgnd; the Vbl connected to the drains of the memory transistors in a selected column and a non-selected column is Vgnd; the voltage Vbpw applied to the well region is Vgnd.

Exemplarily, in the memory array, the value of Vp0 is less than Vpos to keep the storage state of the memory transistor unchanged after an operation of writing "0" is completed.

Exemplarily, in the memory array, Vpos is 4V to 12V; Vneg is −8V to −2V; Vpwr is 0V to 3V.

Exemplarily, in the memory array, Vpos is 7V; Vneg is −4V; Vpwr is 2V; Vp0 is 1.6V.

Exemplarily, in the memory array, during the erasing operation, the row operation mode is adopted, and the Vwl connected to the gates of the selection transistors in the selected row and the non-selected row is 7V; the Vwls connected to the gates of the memory transistors in the selected row is −4V; the Vwls connected to the gates of the memory transistors in the non-selected row is 7V; the Vbl connected to the drains of the memory transistors in all columns is 7V; the voltage Vbpw applied to the well region is 7V;

during the programming and writing operation, the row operation mode is adopted; when data "1" is written, the Vwl connected to the gates of the selection transistors in the selected row and the non-selected row is −4V; the Vwls connected to the gates of the memory transistors in the selected row is 7V; the Vwls connected to the gates of the memory transistors in the non-selected row is −4V; the Vbl connected to the drains of the memory transistors in the same column is −4V; the voltage Vbpw applied to the well region is −4V; when data "0" is written, the Vwl connected to the gates of the selection transistors in the selected row and the non-selected row is −4V; the Vwls connected to the gates of the memory transistors in the selected row is 7V; the Vwls connected to the gates of the memory transistors in the non-selected row is −4V; the Vbl connected to the drains of the memory transistors in the same column is 1.6V; the voltage Vbpw applied to the well region is −4V;

during the reading operation, the Vwl connected to the gates of the selection transistors in the selected row is 2V; the Vwl connected to the gates of the selection transistors in the non-selected row is 0V; the Vwls connected to the gates of the memory transistors in the selected row and the non-selected row is 0V; the Vbl connected to the drains of the memory transistor in the selected column and the non-selected column is 0V; the voltage Vbpw applied to the well region is 0V.

The technical solution of the disclosure at least has the following advantages:

By disposing the selection transistors and the memory transistors adjacent to each other back to back, the disclosure saves more area than the traditional memory device with the two-transistor (selection transistor and memory transistor) separated structure. Further, the source and the gate of the selection transistor in each storage cell are connected together, so that a source line is omitted and the external circuit design is more concise.

BRIEF DESCRIPTION OF THE DRAWINGS

In order to more clearly describe the specific embodiments of the disclosure or the technical solution in the prior art, the drawings needed to be used in the description of the specific embodiments or the prior art will be briefly introduced below. It is obvious that the drawings in the following description are some embodiments of the disclosure. For those skilled in the art, other drawings can be obtained according to these drawings without contributing any inventive labor.

DETAILED DESCRIPTION

Figure 1:
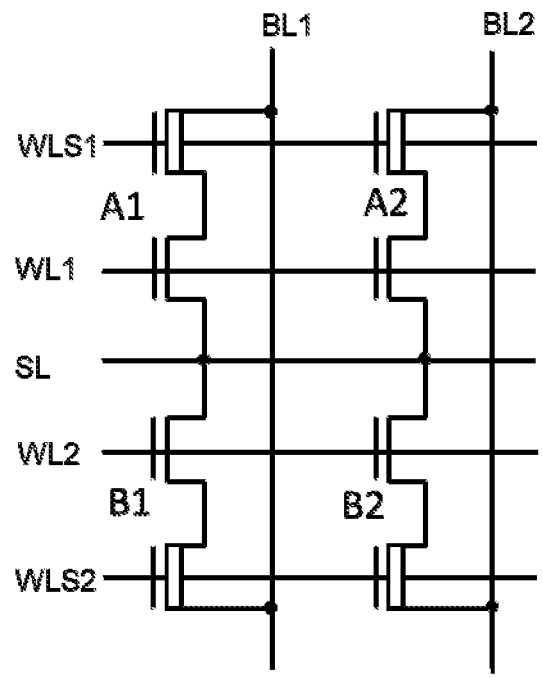
FIG. 1 illustrates a structural diagram of a memory device arranged in a traditional common-source two-transistor array.

The technical solution in the disclosure will be clearly and completely described below with reference to the drawings. Obviously, the described embodiments are part of the embodiments of the disclosure, not all of them. Based on the embodiments in the disclosure, all other embodiments obtained by those skilled in the art without contributing any inventive labor still fall within the scope of protection of the disclosure.

In the description of the disclosure, it should be noted that the orientation or position relationship indicated by the terms "center", "up", "down", "left", "right", "vertical", "horizontal", "inside", "outside" and so on is based on the orientation or position relationship illustrated in the drawings, only for the convenience of describing the disclosure and simplifying the description, rather than indicating or implying that the device or element referred to must have a specific orientation or be constructed and operated in a specific orientation, so it cannot be understood as a limitation to the disclosure. In addition, the terms "first", "second" and "third" are used only for descriptive purposes and cannot be understood as indicating or implying relative importance.

In the description of the disclosure, it should be noted that unless otherwise clearly specified and limited, the terms "mount", "connected" and "connecting" should be understood in a broad sense. For example, it may be fixed connection, removable connection or integrated connection; it may be mechanical connection or electrical connection; it may be direct connection, indirect connection through an intermediate medium, internal communication of two components, wireless connection or wired connection. For those skilled in the art, the specific meanings of the above terms in the disclosure can be understood in specific circumstances.

In addition, the technical features involved in different embodiments of the disclosure described below may be combined with each other as long as they do not constitute a conflict with each other.

An embodiment of the disclosure provides a memory array. Please refer to FIG. 2, which illustrates a structural diagram of a memory array according to an embodiment of the disclosure. the memory array includes a plurality of storage, a plurality of bit lines arranged at intervals along the direction of columns, a plurality of memory transistor word lines arranged at intervals along the direction of rows, and a plurality of selection transistor word lines arranged at intervals along the direction of rows, wherein the storage cells form an array of M rows*N columns, each storage cell includes a selection transistor and a memory transistor connected in series; drains of the memory transistors in the same column are connected to a corresponding bit line; the memory transistor word lines and the selection transistor word lines are arranged alternately, gates of the memory transistors in the same row are connected to a corresponding memory transistor word line, a source and a gate of each selection transistor are connected, the gates of the selection transistors in the same row are connected to a corresponding selection transistor word line, and all storage cells share a well region. Erasing, programming and reading of the storage cells are realized by applying certain voltage to the selection transistor word lines connected to the gates of the selection transistors, the memory transistor word lines connected to the gates of the memory transistors and the bit lines connected to the drains of the memory transistors.

Figure 2:
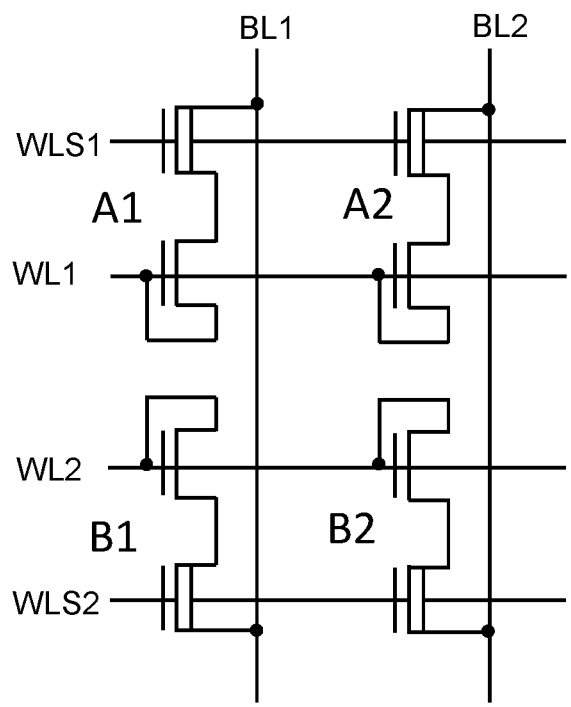
FIG. 2 illustrates a structural diagram of a memory array according to an embodiment of the disclosure.

Referring to FIG. 2, this embodiment takes an array formed by 2 rows*2 columns of storage cells as an example. The memory array includes four storage cells A1, A2, A3 and A4, two bit lines BL1 and BL2 arranged at intervals along the direction of column, two memory transistor word lines WLS1 and WLS2 arranged at intervals along the direction of row, and two selection transistor word lines WL1 and WL2 arranged at intervals along the direction of rows. Next, the erasing, programming and reading operation processes of the storage cells will be described in detail.

TABLE 1

|  | Cell | Vwl | Vwls | Vbl | Vbpw |
|---|---|---|---|---|---|
| Erase | A1, A2 | Vpos | Vneg | Vpos | Vpos |
|  | B1, B2 | Vpos | Vpos | Vpos |  |
| Program | A1 | Vneg | Vpos | Vneg | Vneg |
|  | A2 | Vneg | Vpos | Vneg/Vp0 |  |
|  | B2 | Vneg | Vneg | Vneg/Vp0 |  |
|  | B1 | Vneg | Vneg | Vneg |  |
| Read | A1, A2 | Vpwr | Vgnd | Vgnd | Vgnd |
|  | B1, B2 | Vgnd | Vgnd | Vgnd |  |

In this embodiment, referring to Table 1, it is defined that the voltage applied to the selection transistor word line WL is Vwl, the voltage applied to the memory transistor word line WLS is Vwls, the voltage applied to the bit line BL is Vbl and the voltage applied to the well region is Vbpw.

Further, it is defined that Vpos is first positive voltage during an erasing or writing operation, Vneg is negative voltage during an erasing or writing operation, Vp0 is second positive voltage during a high-voltage operation of the memory, Vpwr is a voltage higher than the threshold voltage of the selection transistor, Vgnd is ground voltage. During an erasing operation, a row operation mode (page mode) is adopted, and the Vwl connected to the gates of the selection transistors in a selected row and a non-selected row is Vpos; the Vwls connected to the gates of the memory transistors in the selected row is Vneg; the Vwls connected to the gates of the memory transistors in the non-selected row is Vpos; the Vbl connected to the drains of the memory transistors in all columns is Vpos; the voltage Vbpw applied to the well region is Vpos.

During a programming and writing operation, the row operation mode (page mode) is adopted; when data "1" is written, the Vwl connected to the gates of the selection transistors in the selected row and the non-selected row is Vneg; the Vwls connected to the gates of the memory transistors in the selected row is Vpos; the Vwls connected to the gates of the memory transistors in the non-selected row is Vneg; the Vbl connected to the drains of the memory transistors in the same column is Vneg; the voltage Vbpw applied to the well region is Vneg; when data "0" is written, the Vwl connected to the gates of the selection transistors in the selected row and the non-selected row is Vneg; the Vwls connected to the gates of the memory transistors in the selected row is Vpos; the Vwls connected to the gates of the memory transistors in the non-selected row is Vneg; the Vbl connected to the drains of the memory transistors in the same column is Vp0; the voltage Vbpw applied to the well region is Vneg.

During a reading operation, the Vwl connected to the gates of the selection transistors in the selected row is Vpwr; the Vwl connected to the gates of the selection transistors in the non-selected row is Vgnd; the Vwls connected to the gates of the memory transistors in the selected row and the non-selected row is Vgnd; the Vbl connected to the drains of the memory transistors in a selected column and a non-selected column is Vgnd; the voltage Vbpw applied to the well region is Vgnd.

In this embodiment, the range of Vpos may be selected to 4V to 12V, for example 7V; the range of Vneg may be selected to be −8V to −2V, for example −4V; the range of Vpwr may be selected to be 0V to 3V, for example 2V, and it is necessary to ensure that the value of Vp0 is less than Vpos. In this embodiment, Vp0 may be 1.6V.

Figure 3:
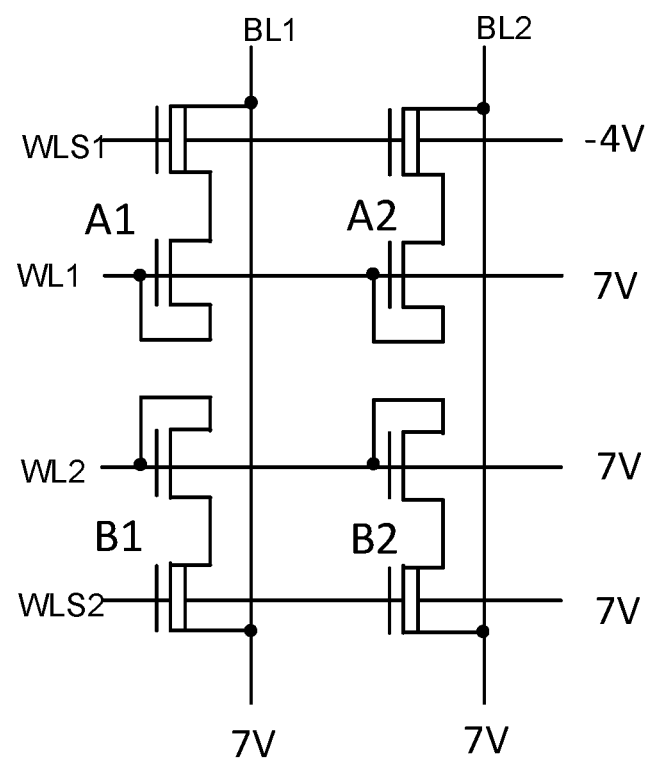
FIG. 3 illustrates a structural diagram of a memory array in an erasing operation according to an embodiment of the disclosure.

Refer to FIG. 3, which illustrates a structural diagram of a memory array in the erasing operation according to the embodiment of the disclosure. During the erasing operation, the row operation mode is adopted, and the Vwl connected to the gates of the selection transistors in the selected row and the non-selected row is 7V; the Vwls connected to the gates of the memory transistors in the selected row is −4V; the Vwls connected to the gates of the memory transistors in the non-selected row is 7V; the Vbl connected to the drains of the memory transistors in all columns is 7V; the voltage Vbpw applied to the well region is 7V.

Figure 4:
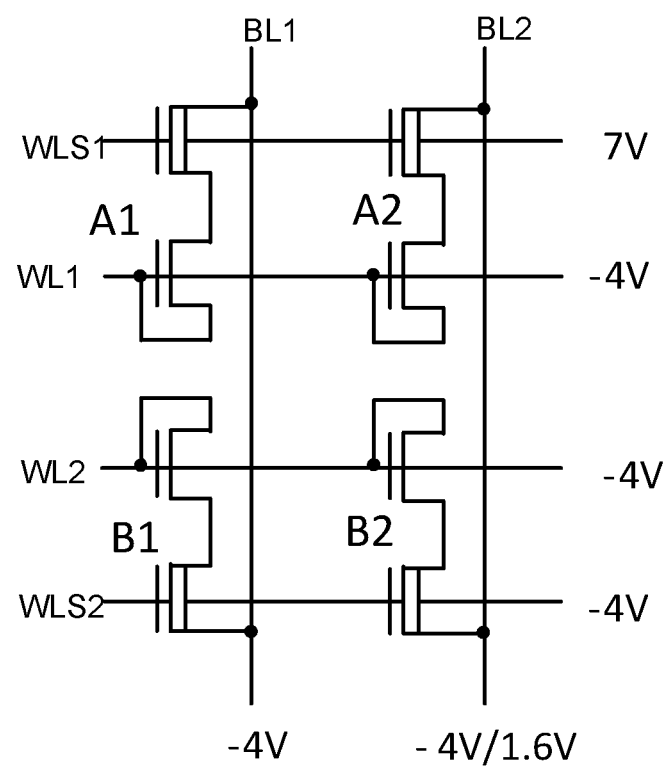
FIG. 4 illustrates a structural diagram of a memory array in a writing operation according to an embodiment of the disclosure.

Refer to FIG. 4, which illustrates a structural diagram of a memory array in the writing operation according to the embodiment of the disclosure. During the programming and writing operation, the row operation mode is adopted; when data "1" is written, the Vwl connected to the gates of the selection transistors in the selected row and the non-selected row is −4V; the Vwls connected to the gates of the memory transistors in the selected row is 7V; the Vwls connected to the gates of the memory transistors in the non-selected row is −4V; the Vbl connected to the drains of the memory transistors in the same column is −4V; the voltage Vbpw applied to the well region is −4V; when data "0" is written, the Vwl connected to the gates of the selection transistors in the selected row and the non-selected row is −4V; the Vwls connected to the gates of the memory transistors in the selected row is 7V; the Vwls connected to the gates of the memory transistors in the non-selected row is −4V; the Vbl connected to the drains of the memory transistors in the same column is 1.6V; the voltage Vbpw applied to the well region is −4V. When data "0" is written, the value of Vp0 needs to be less than Vpos to keep the storage state of the memory transistor unchanged after the operation of writing "0" is completed.

Figure 5:
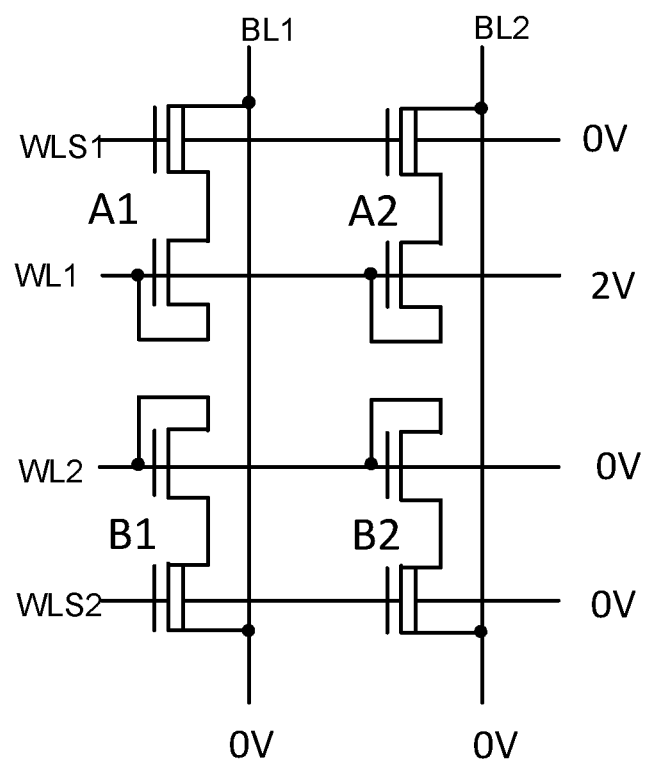
FIG. 5 illustrates a structural diagram of a memory array in a reading operation according to an embodiment of the disclosure.

Refer to FIG. 5, which illustrates a structural diagram of a memory array in the reading operation according to the embodiment of the disclosure. During the reading operation, the Vwl connected to the gates of the selection transistors in the selected row (the first row) is 2V; the Vwl connected to the gates of the selection transistors in the non-selected row is 0V; the Vwls connected to the gates of the memory transistors in the selected row and the non-selected row is 0V; the Vbl connected to the drains of the memory transistor in the selected column and the non-selected column is 0V; the voltage Vbpw applied to the well region is 0V. At this time, the current of the selected column (the first column) is read to obtain the state of the storage cell A1.

To sum up, the disclosure provides a memory array, which includes a plurality of storage cells, a plurality of bit lines, a plurality of memory transistor word lines and a plurality of selection transistor word lines, wherein the storage cells form an array of M rows*N columns; each storage cell includes a selection transistor and a memory transistor connected in series; a source and a gate of each selection transistor are connected, and the gates of the selection transistors in the same row are connected to a corresponding selection transistor word line. By disposing the selection transistors and the memory transistors adjacent to each other back to back, the disclosure saves more area than the traditional SONOS device with the two-transistor (selection transistor and memory transistor) separated structure. Further, the source and the gate of the selection transistor in each storage cell are connected together, so that a source line is omitted and the external circuit design is more concise.

Obviously, the above embodiment is only an example for clear description, not a limitation to the embodiment. For those skilled in the art, other changes or variations in different forms may be made on the basis of the above description. It is unnecessary and impossible to enumerate all the embodiments here. Obvious changes or variations derived therefrom are still within the scope of protection of the disclosure.

What is claimed is:

1. A memory array, wherein the memory array comprises:
    a plurality of storage cells forming an array of M rows*N columns, each storage cell comprising a selection transistor and a memory transistor connected in series;
    a plurality of bit lines arranged at intervals along the direction of columns, wherein drains of the memory transistors in the same column are connected to a corresponding bit line;
    a plurality of memory transistor word lines arranged at intervals along the direction of rows; and
    a plurality of selection transistor word lines arranged at intervals along the direction of rows, wherein the memory transistor word lines and the selection transistor word lines are arranged alternately, gates of the memory transistors in the same row are connected to a corresponding memory transistor word line, a source and a gate of each selection transistor are connected, the gates of the selection transistors in the same row are connected to a corresponding selection transistor word line, and all storage cells share a well region;
    erasing, programming and reading of the storage cells are realized by applying certain voltage to the selection transistor word lines connected to the gates of the selection transistors, the memory transistor word lines connected to the gates of the memory transistors and the bit lines connected to the drains of the memory transistors.

2. The memory array according to claim 1, wherein it is defined that the voltage applied to the selection transistor word line is Vwl, the voltage applied to the memory transistor word line is Vwls, the voltage applied to the bit line is Vbl and the voltage applied to the well region is Vbpw;
    it is defined that Vpos is first positive voltage, Vneg is negative voltage, Vpwr is a voltage higher than the threshold voltage of the selection transistor, Vgnd is ground voltage and Vp0 is second positive voltage;
    during an erasing operation, a row operation mode is adopted, and the Vwl connected to the gates of the selection transistors in a selected row and a non-selected row is Vpos; the Vwls connected to the gates of the memory transistors in the selected row is Vneg; the Vwls connected to the gates of the memory transistors in the non-selected row is Vpos; the Vbl connected to the drains of the memory transistors in all columns is Vpos; the voltage Vbpw applied to the well region is Vpos;
    during a programming and writing operation, the row operation mode is adopted; when data "1" is written, the Vwl connected to the gates of the selection transistors in the selected row and the non-selected row is Vneg; the Vwls connected to the gates of the memory transistors in the selected row is Vpos; the Vwls connected to the gates of the memory transistors in the non-selected row is Vneg; the Vbl connected to the drains of the memory transistors in the same column is Vneg, and the voltage Vbpw applied to the well region is Vneg; when data "0" is written, the Vwl connected to the gates of the selection transistors in the selected row and the non-selected row is Vneg; the Vwls connected to the gates of the memory transistors in the selected row is Vpos; the Vwls connected to the gates of the memory transistors in the non-selected row is Vneg; the Vbl connected to the drains of the memory transistors in the same column is Vp0; the voltage Vbpw applied to the well region is Vneg;
    during a reading operation, the Vwl connected to the gates of the selection transistors in the selected row is Vpwr; the Vwl connected to the gates of the selection transistors in the non-selected row is Vgnd; the Vwls connected to the gates of the memory transistors in the selected row and the non-selected row is Vgnd; the Vbl connected to the drains of the memory transistors in a selected column and a non-selected column is Vgnd; the voltage Vbpw applied to the well region is Vgnd.

3. The memory array according to claim 2, wherein the value of Vp0 is less than Vpos to keep the storage state of the memory transistor unchanged after an operation of writing "0" is completed.

4. The memory array according to claim 2, wherein Vpos is 4V to 12V; Vneg is −8V to −2V; Vpwr is 0V to 3V; Vp0<Vpos.

5. The memory array according to claim 4, wherein Vpos is 7V; Vneg is −4V; Vpwr is 2V; Vp0 is 1.6V.

6. The memory array according to claim 5, wherein:
during the erasing operation, the row operation mode is adopted, and the Vwl connected to the gates of the selection transistors in the selected row and the non-selected row is 7V; the Vwls connected to the gates of the memory transistors in the selected row is −4V; the Vwls connected to the gates of the memory transistors in the non-selected row is 7V; the Vbl connected to the drains of the memory transistors in all columns is 7V; the voltage Vbpw applied to the well region is 7V;

during the programming and writing operation, the row operation mode is adopted; when data "1" is written, the Vwl connected to the gates of the selection transistors in the selected row and the non-selected row is −4V; the Vwls connected to the gates of the memory transistors in the selected row is 7V; the Vwls connected to the gates of the memory transistors in the non-selected row is −4V; the Vbl connected to the drains of the memory transistors in the same column is −4V; the voltage Vbpw applied to the well region is −4V; when data "0" is written, the Vwl connected to the gates of the selection transistors in the selected row and the non-selected row is −4V; the Vwls connected to the gates of the memory transistors in the selected row is 7V; the Vwls connected to the gates of the memory transistors in the non-selected row is −4V; the Vbl connected to the drains of the memory transistors in the same column is 1.6V; the voltage Vbpw applied to the well region is −4V;

during the reading operation, the Vwl connected to the gates of the selection transistors in the selected row is 2V; the Vwl connected to the gates of the selection transistors in the non-selected row is 0V; the Vwls connected to the gates of the memory transistors in the selected row and the non-selected row is 0V; the Vbl connected to the drains of the memory transistor in the selected column and the non-selected column is 0V; the voltage Vbpw applied to the well region is 0V.

* * * * *